United States Patent
Ching et al.

(10) Patent No.: US 9,773,892 B2
(45) Date of Patent: Sep. 26, 2017

(54) ISOLATION STRUCTURE OF FIN FIELD EFFECT TRANSISTOR

(71) Applicant: Taiwan Semiconductor Manufacturing Company, Ltd., Hsin-Chu (TW)

(72) Inventors: Kuo-Cheng Ching, Zhubei (TW); Guan-Lin Chen, Baoshan Township (TW); Chao-Hsiung Wang, Hsin-Chu (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 51 days.

(21) Appl. No.: 15/017,224

(22) Filed: Feb. 5, 2016

(65) Prior Publication Data

US 2016/0172470 A1    Jun. 16, 2016

Related U.S. Application Data

(62) Division of application No. 14/024,148, filed on Sep. 11, 2013, now Pat. No. 9,306,069.

(51) Int. Cl.
*H01L 29/66* (2006.01)
*H01L 29/78* (2006.01)
(Continued)

(52) U.S. Cl.
CPC .... *H01L 29/66818* (2013.01); *H01L 21/2253* (2013.01); *H01L 21/30604* (2013.01);
(Continued)

(58) Field of Classification Search
None
See application file for complete search history.

(56) References Cited

U.S. PATENT DOCUMENTS

| | | | |
|---|---|---|---|
| 8,362,572 B2 | 1/2013 | Huang et al. | |
| 8,642,409 B2 * | 2/2014 | Nakazawa | H01L 29/66795 257/E21.413 |

(Continued)

OTHER PUBLICATIONS

Tsai, J. C. C. et al. "Point Defect Generation during Phosphorus Diffusion in Silicon," Journal of the Electrochemical Society 1987, vol. 134, Issue 6, Mar. 14, 1986, pp. 1508-1518.
(Continued)

*Primary Examiner* — Jesse Y Miyoshi
*Assistant Examiner* — Nilufa Rahim
(74) *Attorney, Agent, or Firm* — Slater Matsil, LLP (57) ABSTRACT

A representative fin field effect transistor (FinFET) includes a substrate having a major surface; a fin structure protruding from the major surface having a lower portion comprising a first semiconductor material having a first lattice constant; an upper portion comprising the first semiconductor material. A bottom portion of the upper portion comprises a dopant with a first peak concentration. A middle portion is disposed between the lower portion and upper portion, where the middle portion comprises a second semiconductor material having a second lattice constant different from the first lattice constant. An isolation structure surrounds the fin structure, where a portion of the isolation structure adjacent to the bottom portion of the upper portion comprises the dopant with a second peak concentration equal to or greater than the first peak concentration.

20 Claims, 12 Drawing Sheets

(51) Int. Cl.
   *H01L 21/762* (2006.01)
   *H01L 29/10* (2006.01)
   *H01L 21/225* (2006.01)
   *H01L 21/306* (2006.01)
   *H01L 21/3115* (2006.01)

(52) U.S. Cl.
   CPC ...... *H01L 21/31155* (2013.01); *H01L 21/762* (2013.01); *H01L 21/76224* (2013.01); *H01L 21/76237* (2013.01); *H01L 29/1083* (2013.01); *H01L 29/66795* (2013.01); *H01L 29/785* (2013.01); *H01L 29/7842* (2013.01); *H01L 29/7848* (2013.01); *H01L 29/7849* (2013.01)

(56) References Cited

U.S. PATENT DOCUMENTS

| | | |
|---|---|---|
| 2006/0076625 A1 | 4/2006 | Lee et al. |
| 2007/0120156 A1 | 5/2007 | Liu et al. |
| 2007/0267695 A1 | 11/2007 | Lee |
| 2009/0278196 A1 | 11/2009 | Chang et al. |
| 2010/0163971 A1 | 7/2010 | Hung et al. |
| 2011/0207309 A1 | 8/2011 | Izumida et al. |
| 2012/0193751 A1 | 8/2012 | Kawasaki et al. |
| 2012/0241818 A1 | 9/2012 | Kavalieros et al. |
| 2012/0319211 A1 | 12/2012 | van Dal et al. |
| 2014/0011341 A1 | 1/2014 | Maszara et al. |
| 2014/0357029 A1 | 12/2014 | Loubet et al. |
| 2014/0377926 A1 | 12/2014 | Kim et al. |
| 2015/0024573 A1 | 1/2015 | Jacob et al. |
| 2015/0054039 A1 | 2/2015 | Ching et al. |

OTHER PUBLICATIONS

Deal, B.E. et al., "Thermal Oxidation of Heavily Doped Silicon," Journal of the Electrochemical Society 1965, vol. 112, Issue 4, Sep. 1964, pp. 430-435.

\* cited by examiner

ISOLATION STRUCTURE OF FIN FIELD EFFECT TRANSISTOR

This application claims priority to and is a divisional of U.S. patent application Ser. No. 14/024,148, filed Sep. 11, 2013, and entitled "Isolation Structure of Fin Field Effect Transistor," which application is incorporated herein by reference.

TECHNICAL FIELD

The disclosure relates to integrated circuit fabrication, and more particularly to a fin field effect transistor with an isolation structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, substrate punch-through effect causes high leakage current of the FinFET, thereby degrading device performance.

BRIEF DESCRIPTION OF THE DRAWINGS

The present disclosure may be best understood from the following detailed description when read with the accompanying figures. It is emphasized that, in accordance with standard practice in the industry, various features may not be drawn to scale and are used for illustration purposes only. In fact, the dimensions of the various features may be arbitrarily increased or reduced for clarity of discussion.

DETAILED DESCRIPTION

It will be understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
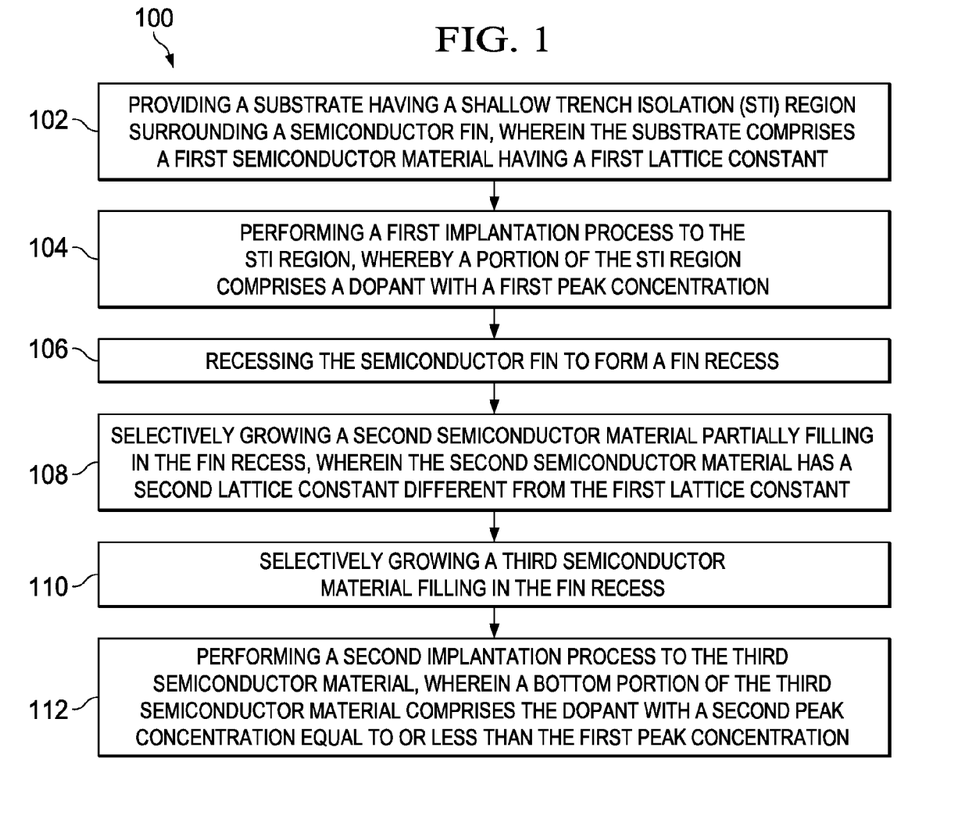
FIG. 1 is a flowchart illustrating a representative method of fabricating a FinFET in accordance with various aspects of the present disclosure.

FIG. 1 representatively illustrates a flowchart of a method 100 of fabricating a fin field effect transistor (FinFET) according to various aspects of the present disclosure. The method 100 begins with step 102 in which a substrate having a shallow trench isolation (STI) region surrounding a semiconductor fin is provided, where the substrate comprises a first semiconductor material having a first lattice constant. The method 100 continues with step 104 in which a first implantation process is performed to the STI region, whereby a portion of the STI region comprises a dopant with a first peak concentration. The method 100 continues with step 106 in which the semiconductor fin is recessed to form a fin recess. The method 100 continues with step 108 in which a second semiconductor material partially filling the fin recess is selectively grown, where the second semiconductor material has a second lattice constant different from the first lattice constant. The method 100 continues with step 110 in which a third semiconductor material filling the fin recess is selectively grown. The method 100 continues with step 112 in which a second implantation process is performed to the third semiconductor material, where a bottom portion of the third semiconductor material comprises the dopant with a second peak concentration equal to or less than the first peak concentration. The discussion that follows illustrates representative embodiments of FinFETs that can be fabricated according to the method 100 of FIG. 1.

Figure 2:
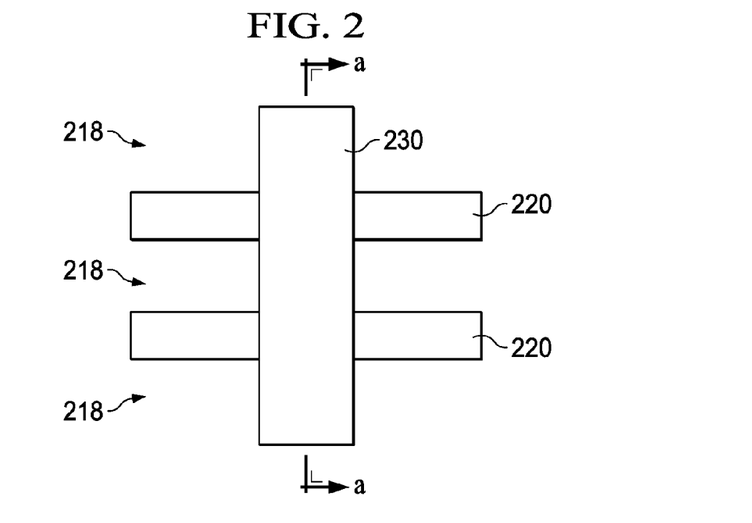
FIG. 2 shows a top view of a FinFET comprising an isolation structure in accordance with representative aspects of the present disclosure.
Figure 11:
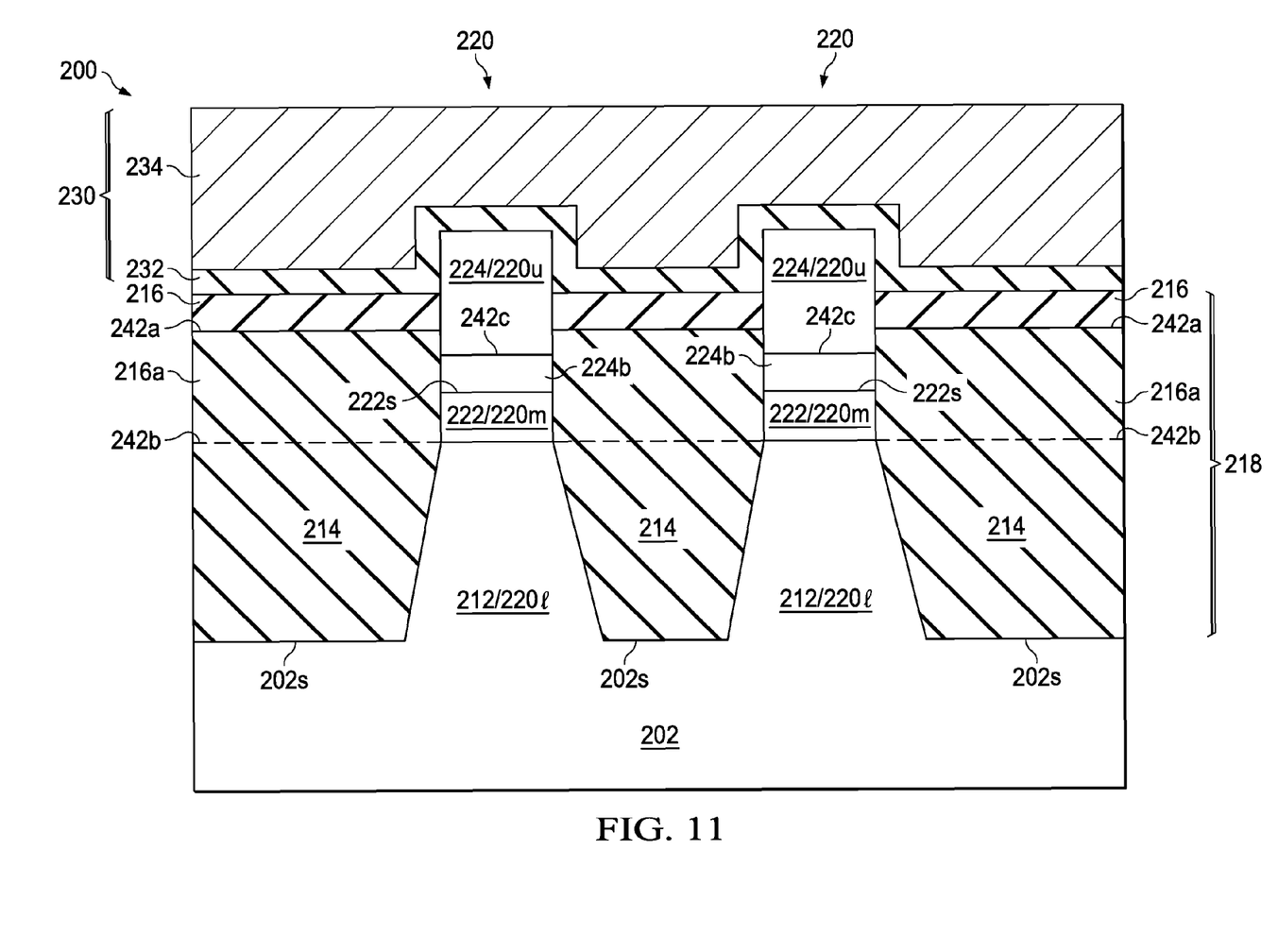
Figure 12:
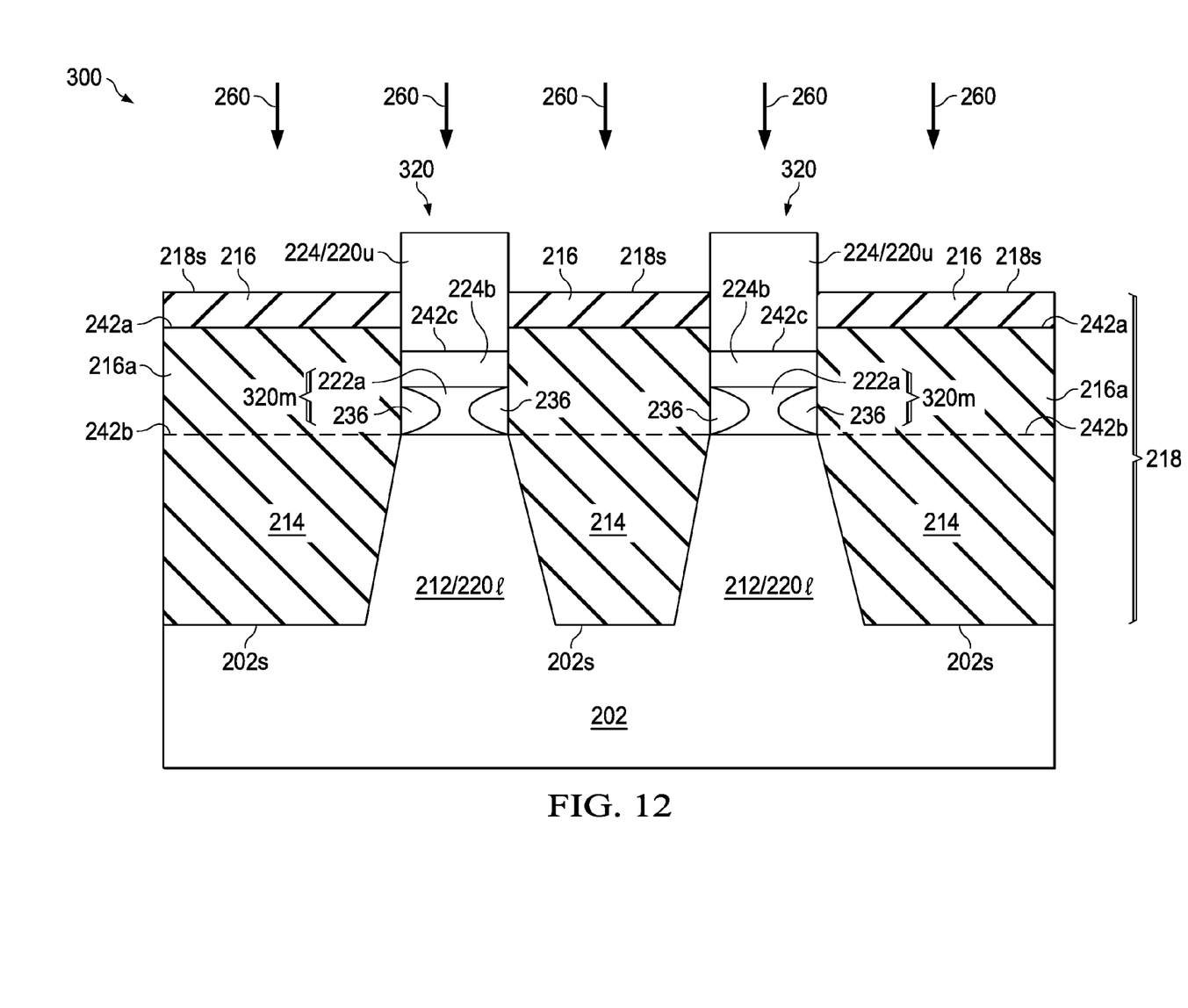
FIGS. 12 and 13 are cross-sectional views of a FinFET at various stages of fabrication in accordance with various representative embodiments of the present disclosure.
Figure 13:
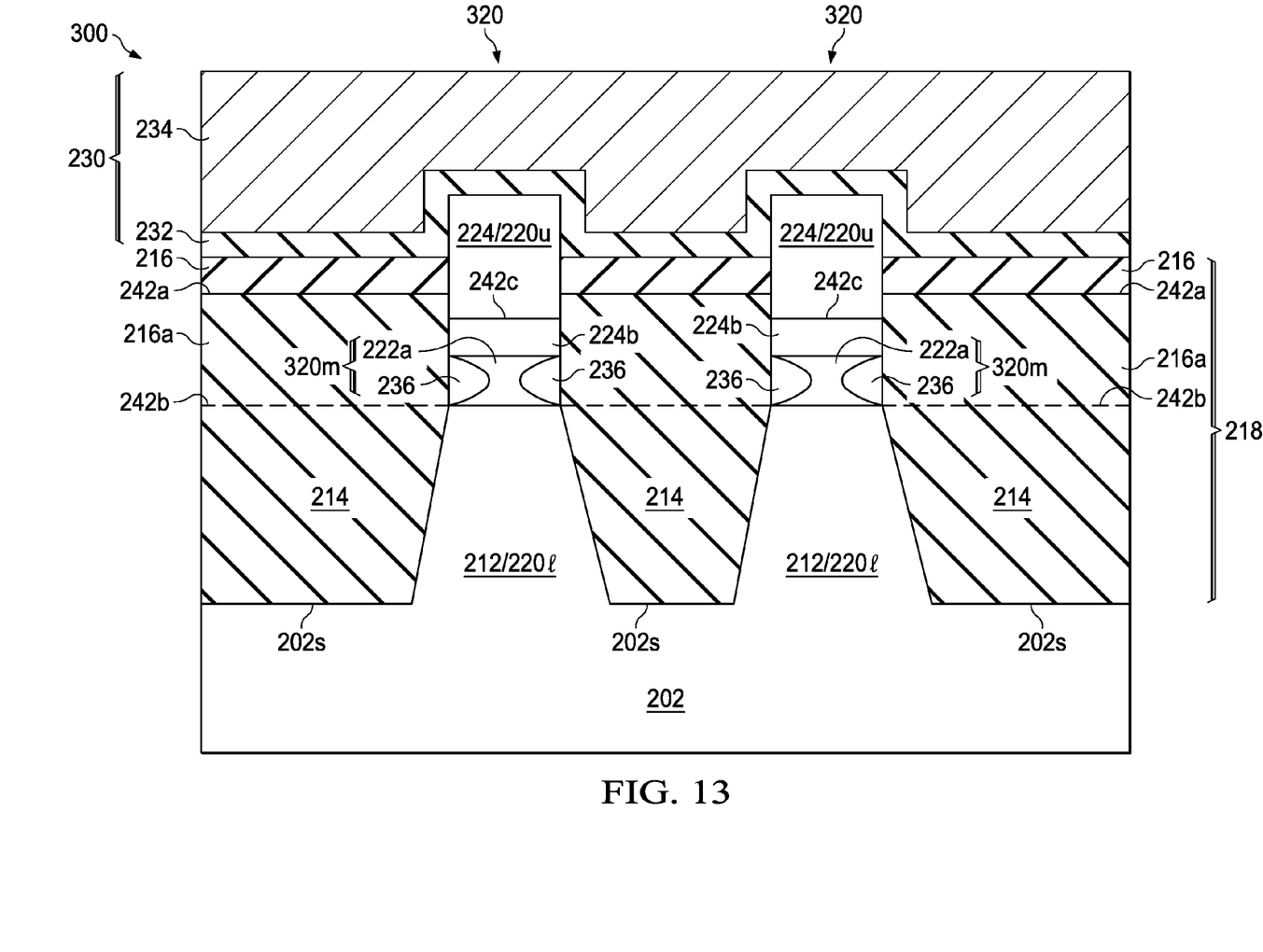

FIG. 2 shows a top view of a fin field effect transistor (FinFET) 200 comprising an isolation structure 218 according to various aspects of the present disclosure. FIGS. 3-11 are cross-sectional views of a FinFET 200 taken along the line a-a of FIG. 2 at various stages of fabrication according to various embodiment of the present disclosure. FIGS. 12 and 13 are cross-sectional views of a FinFET 300 taken along the line a-a of FIG. 2 at various stages of fabrication according to various embodiment of the present disclosure. As employed in the present disclosure, the FinFET 200 or 300 refers to any fin-based, multi-gate transistor. Other transistor structures and analogous structures are within the contemplated scope of the disclosure. The FinFET 200 or 300 may be included in, e.g., a microprocessor, memory cell, and/or other integrated circuit (IC).

It may be noted that the method of FIG. 1 does not produce a completed FinFET 200 or 300. A completed FinFET 200 or 300 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 13 are simplified for a better understanding of the concepts of the present disclosure. For example, although the figures illustrate the FinFET 200 or 300, it is understood an IC may comprise a number of other devices comprising, e.g., resistors, capacitors, inductors, fuses, etc.

FIG. 2 representatively illustrates a FinFET 200 or 300 fabricated using the steps in FIG. 1. For illustration, the FinFET 200 or 300 comprises a fin structure 220, an isolation structure 218 surrounding the fin structure 220 and a gate structure 230 traversing over a channel portion of the fin structure 220. For illustration, the FinFET 200 or 300 comprises two fins. In some embodiments, the FinFET 200 or 300 may comprise less than or greater than two fins, for example, one fin or three fins.

Figure 3:
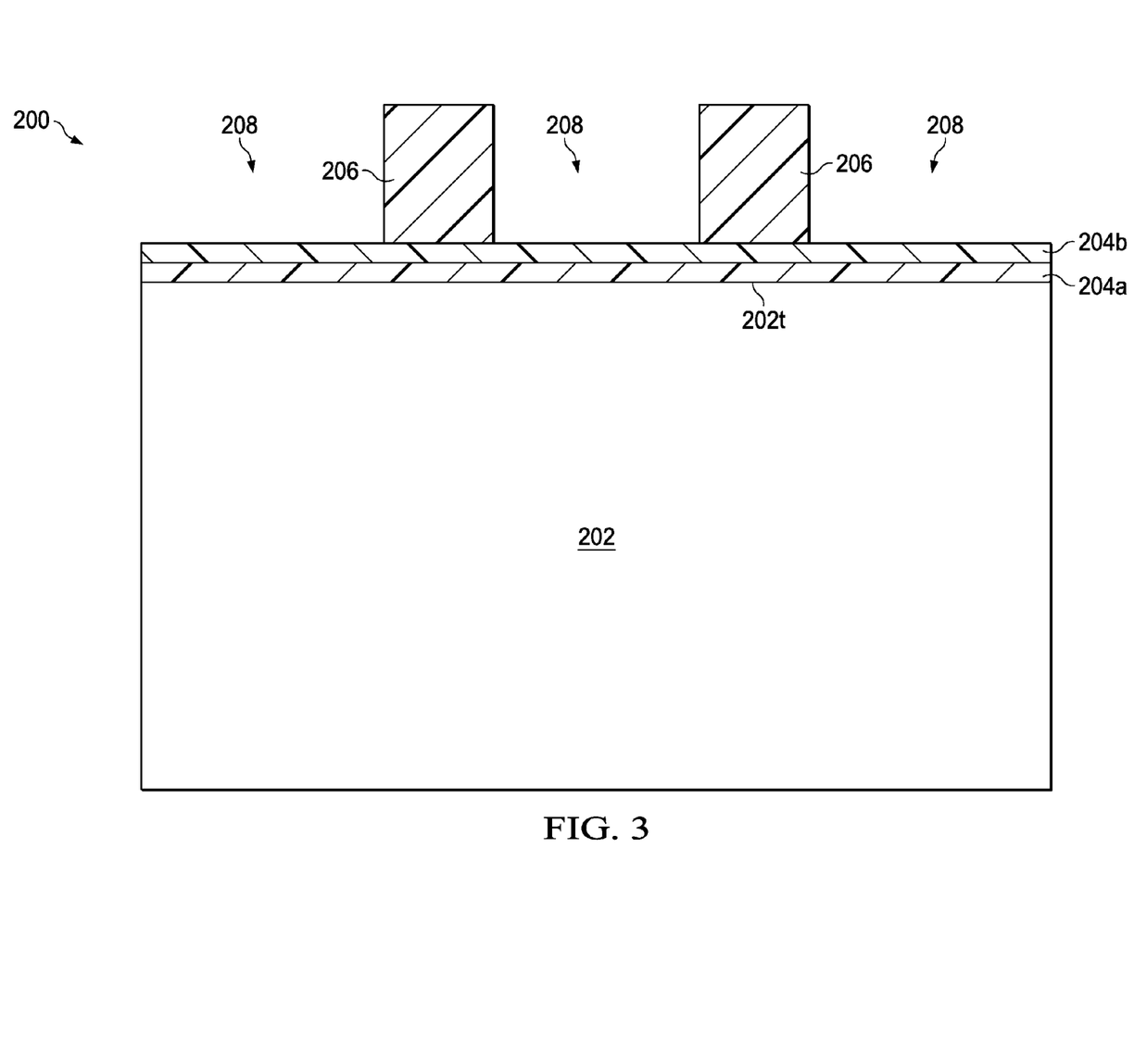
FIGS. 3-11 are cross-sectional views of a FinFET at various stages of fabrication in accordance with a representative embodiment of the present disclosure.
Figure 4:
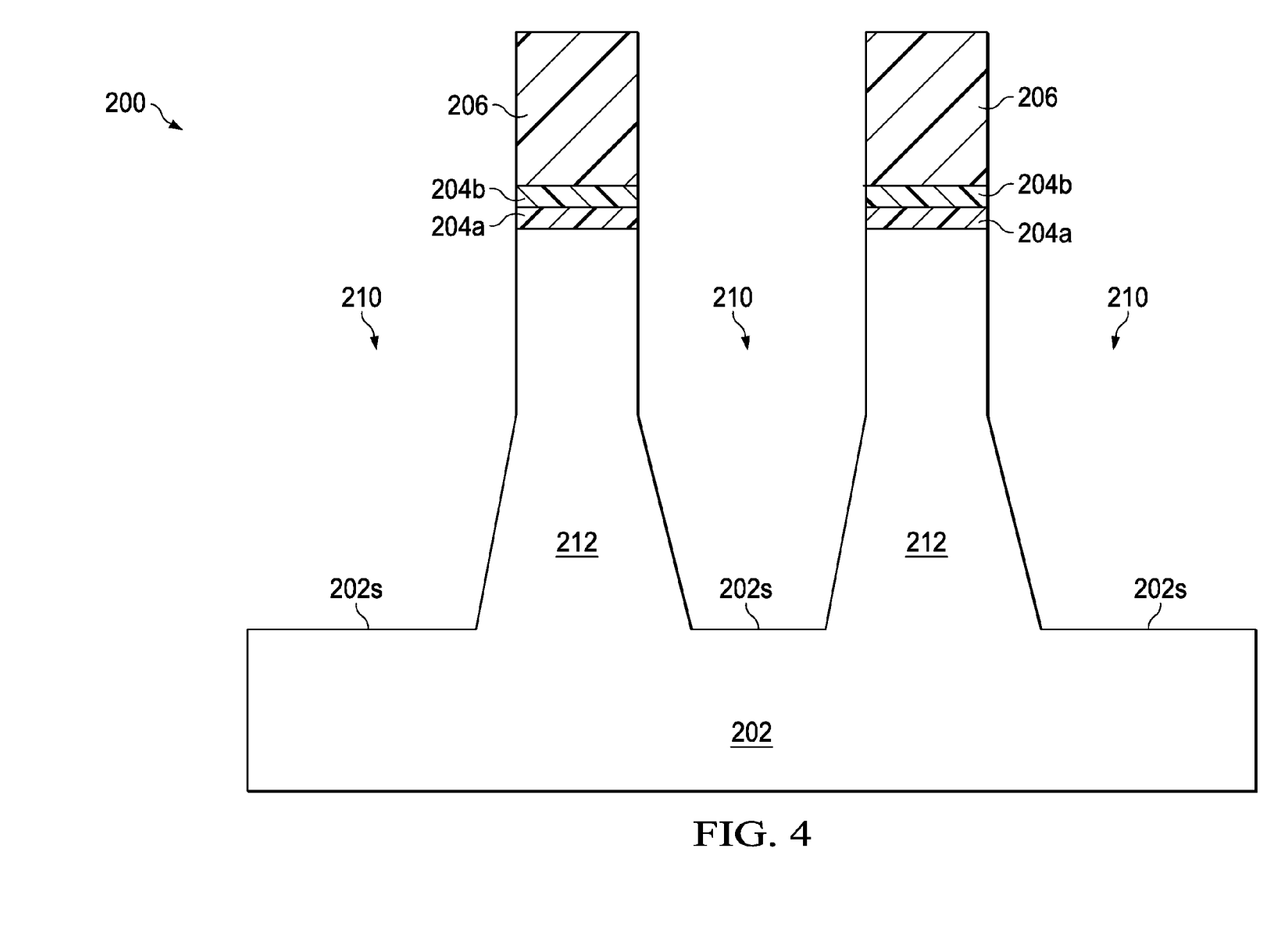
Figure 5:
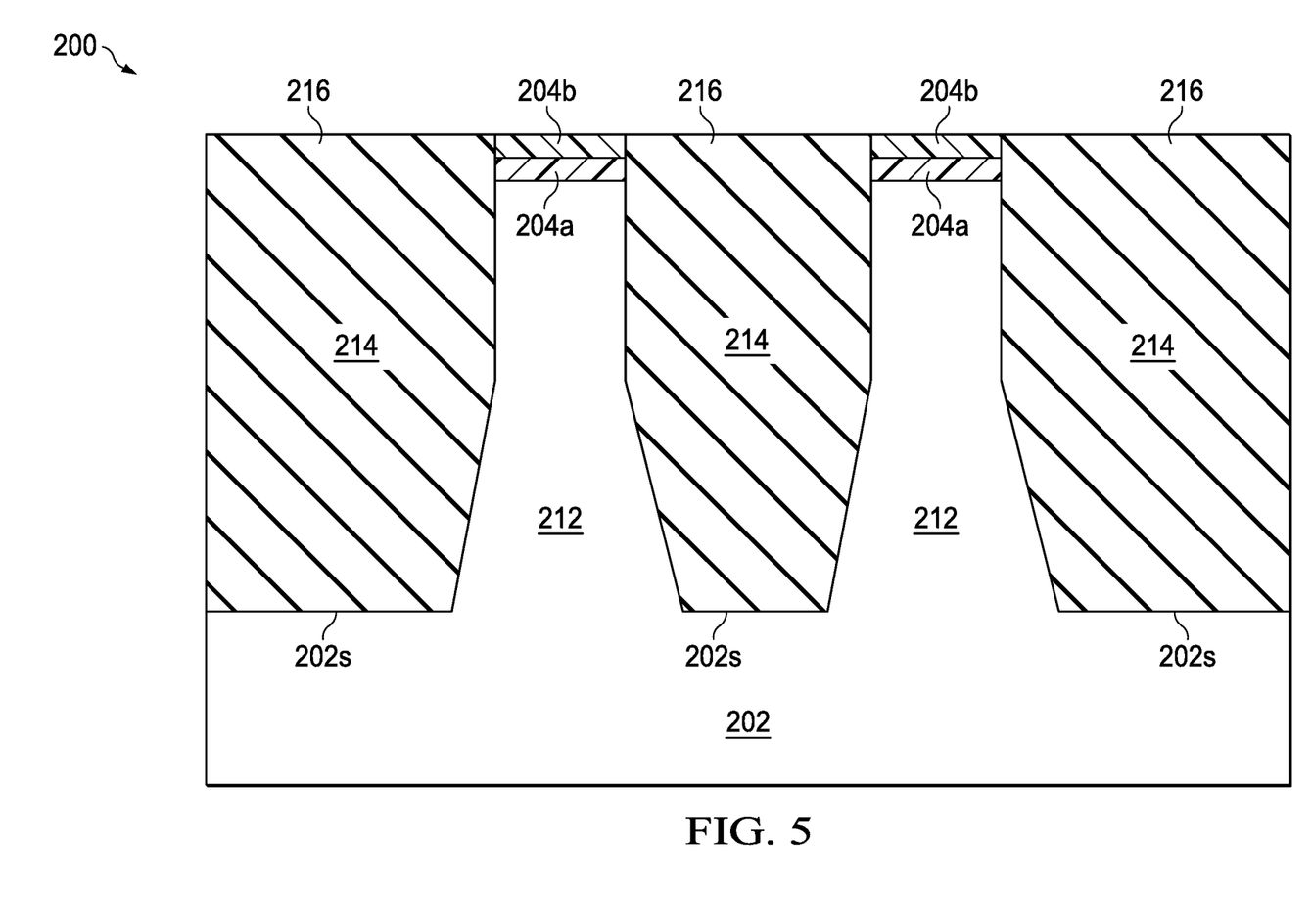

As representatively depicted in FIGS. 3-5, and step 102 of FIG. 1, a substrate 202 having a shallow trench isolation (STI) region 216 surrounding a semiconductor fin 212 is provided (shown in FIG. 3), wherein the substrate 202 comprise a first semiconductor material having a first lattice constant, and hence is also referred to as first semiconductor material 202 in the present disclosure. In some embodiments, the substrate 202 comprises a crystalline silicon substrate (e.g., wafer). Substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 202 may comprise some other suitable elemental semiconductor, such as a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In one embodiment, a pad layer 204a and a mask layer 204b are formed on a top surface 202t of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. Pad layer 204a may also act as an etch stop layer for etching mask layer 204b. In an embodiment, mask layer 204b is formed of silicon nitride, for example, using low-pressure chemical vapor deposition (LPCVD) or plasma enhanced chemical vapor deposition (PECVD). Mask layer 204b may be used as a hard mask during subsequent photolithography processes. A photo-sensitive layer 206 may be formed on the mask layer 204b and then patterned, forming openings 208 in the photo-sensitive layer 206.

As representatively depicted in FIGS. 4 and 5, for forming shallow trench isolation (STI) regions (such as STI regions 216 shown in FIG. 5) within substrate 202, the structure in FIG. 4 may be produced by forming semiconductor fins 212 in the substrate 202. In some embodiments, mask layer 204b and pad layer 204a are etched through openings 208 to expose underlying semiconductor substrate 202. The exposed semiconductor substrate 202 may then be etched to form trenches 210 with major surfaces 202s of the semiconductor substrate 202 disposed at bottom portions of trenches 210. Portions of the semiconductor substrate 202 between trenches 210 form the semiconductor fins 212. In some embodiments, trenches 210 may be strips (viewed from the top of FinFET 200 or 300) parallel to each other, and relatively closely spaced with respect to each other. In some embodiments, trenches 210 may be continuous and surround semiconductor fins 212.

In the representatively illustrated embodiment, semiconductor fins 212 protruding from the substrate major surface 202s comprise two fins. Photo-sensitive layer 206 may then be removed. Thereafter, a cleaning may be performed to remove a native oxide of the semiconductor substrate 202. Cleaning may be performed using, e.g., diluted hydrofluoric (DHF) acid.

Liner oxide (not shown) may then be optionally formed in trenches 210. In an embodiment, liner oxide may be a thermal oxide having a thickness ranging from about 20 Å to about 500 Å. In some embodiments, liner oxide may be formed using in-situ steam generation (ISSG) and/or the like. The formation of liner oxide rounds corners of trenches 210, which reduces local electrical fields, and hence improves performance of a resulting integrated circuit.

FIG. 5 representatively depicts resulting structure after deposition of a dielectric material 214. In some embodiments, trenches 210 are filled with dielectric material 214. Dielectric material 214 may include, e.g., silicon oxide, and hence may also be referred to as oxide 214 in the present disclosure. In some embodiments, other dielectric materials, such as silicon nitride, silicon oxynitride, fluoride-doped silicate glass (FSG), and/or a low-K dielectric material, may also be used. In some embodiments, oxide 214 may be formed using a high-density-plasma (HDP) CVD process, using silane ($SiH_4$) and oxygen ($O_2$) as reacting precursors. In other embodiments, oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiments, oxide 214 may be formed using a spin-on-dielectric (SOD) process, such as hydrogen silsesquioxane (HSQ) or methyl silsesquioxane (MSQ). A chemical mechanical polish (CMP) may then be performed to form STI regions 216.

Process steps up to this point have provided substrate 202 having STI regions 216 surrounding semiconductor fins 212. Conventionally, by introducing anti-punch through (APT) dopants into semiconductor fins 212, each fin of semiconductor fins 212 is isolated from neighboring fins. However, substrate punch through effect in semiconductor fins 212 may occur if some APT dopants diffuse from semiconductor fins 212 into STI regions 216. Insufficient remaining APT dopants in semiconductor fins 212 may provide a carrier transportation path between adjacent fins and cause high leakage current of the FinFET, thereby degrading device performance.

Accordingly, processing discussed below with reference to FIGS. 6-9 may form a doped portion in STI region 216 to substantially impede or otherwise reduce ATP dopant out-diffusion from semiconductor fin 212. Problems associated with high leakage current due to insufficient APT dopant concentration may be avoided or otherwise reduced. Thus, Applicant's method may achieve desired device performance characteristics attendant to at least reduced punch-through effect and leakage.

Figure 6:
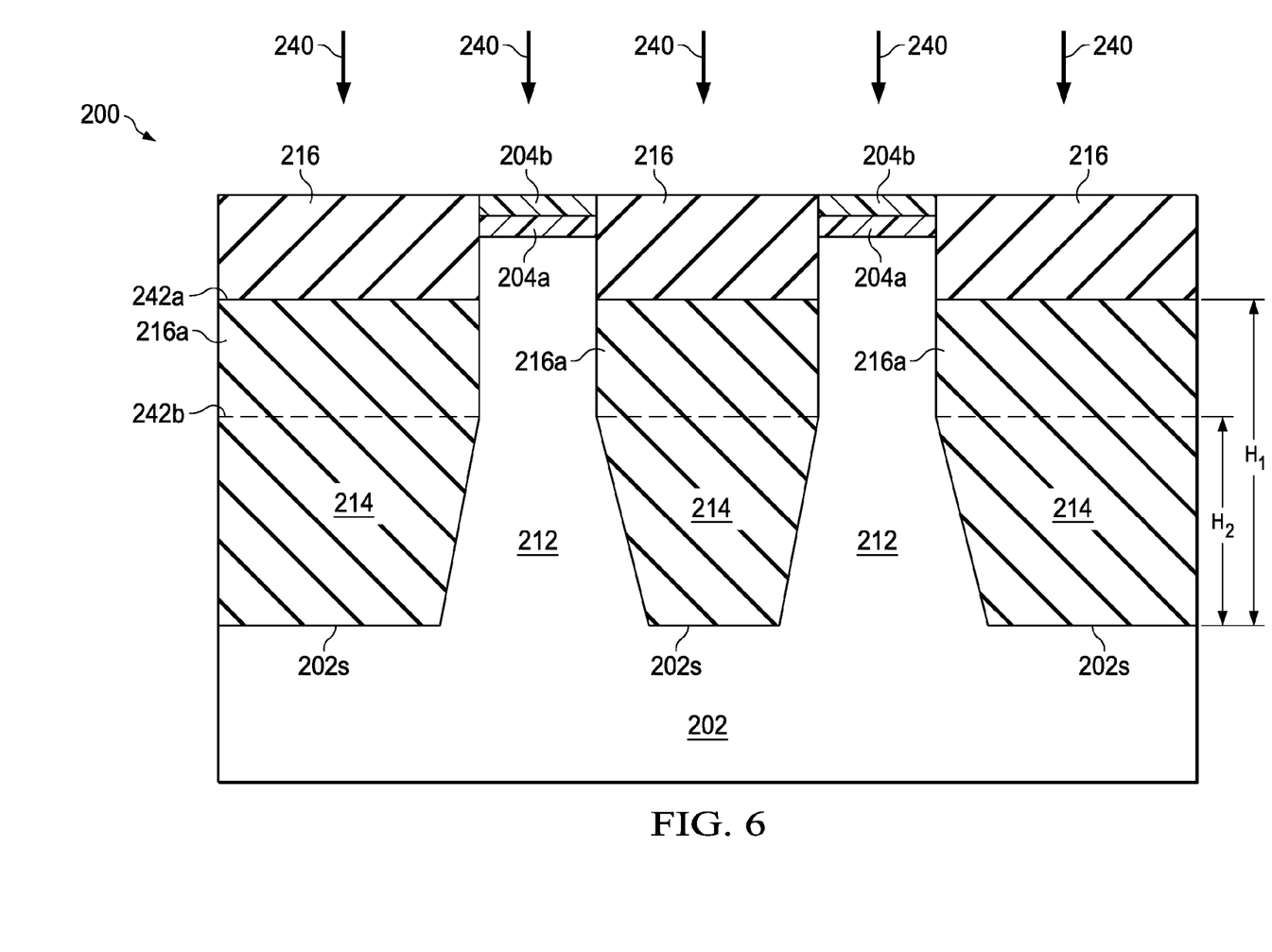

As representatively depicted in FIG. 6 and step 104 of FIG. 1, illustrating fabrication of a doped portion in STI region 216 to enhance device performance, the structure of FIG. 6 may be produced by performing a first implantation process 240 to STI region 216, whereby a doped portion 216a of STI region 216 comprises a dopant 242 with a peak concentration 242a or 242b. In some embodiments, dopant 242 comprises B or $BF_2$. Doped portion 216a in STI region 216 may substantially impede or otherwise reduce ATP dopant out-diffusion from semiconductor fin 212 (shown in FIG. 9).

In some embodiment, e.g., using mask layer 204b and pad layer 204a as a hard mask, a step of performing a first implantation process 240 to STI region 216 may be performed at an energy between about 50 KeV to about 100 KeV, and at a dose between about 1E13 atoms/cm$^2$ to about 1E14 atoms/cm$^2$. As a result of implantation process 240, rather than implanting into semiconductor fin 212, a peak concentration 242a or 242b of dopant 242 may be produced in doped portion 216a of STI region 216 adjacent to semiconductor fin 212. A height of peak concentration 242a or 242b and substrate surface 202s depends on the implantation energy. In some embodiments, a first peak concentration 242a of dopant 242 with 60 KeV (e.g., lower energy) has a first height $H_1$ (solid line). In some embodiments, a second peak concentration 242b of dopant 242 with 120 KeV (e.g., higher energy) has second height $H_2$ less than the first height $H_1$ (dashed line). In some embodiments, STI region 216 may comprise first peak concentration 242a and second peak concentration 242b if implantation process 240 is performed with different implantation energies at a different time.

Mask layer 204b and pad layer 204a may then be removed. In one embodiment, mask layer 204b is formed of silicon nitride. Mask layer 204b may be removed using a wet process using hot $H_3PO_4$, while pad layer 204a may be removed using diluted HF acid, if formed of silicon oxide.

Figure 7:
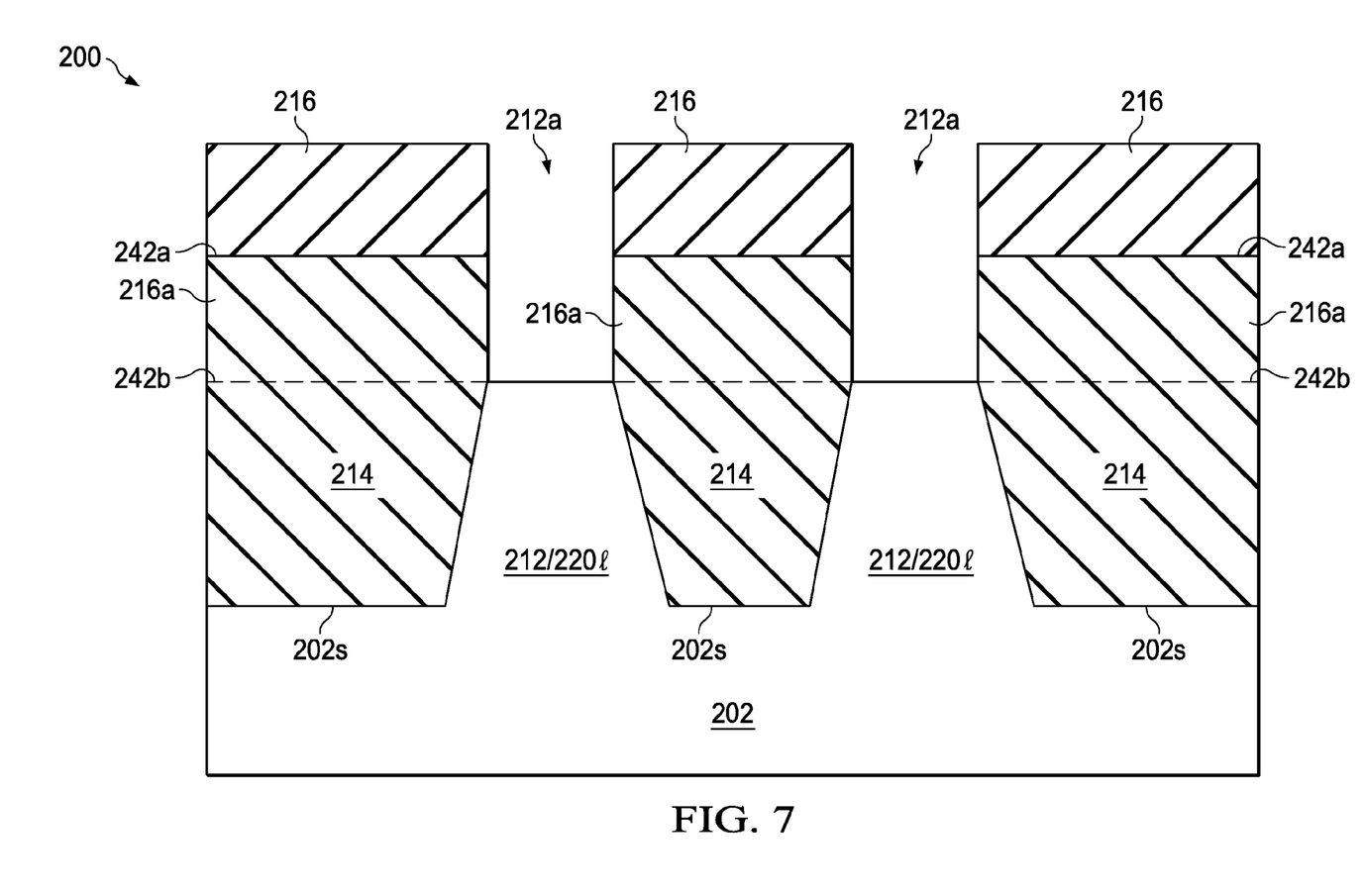
Figure 8:
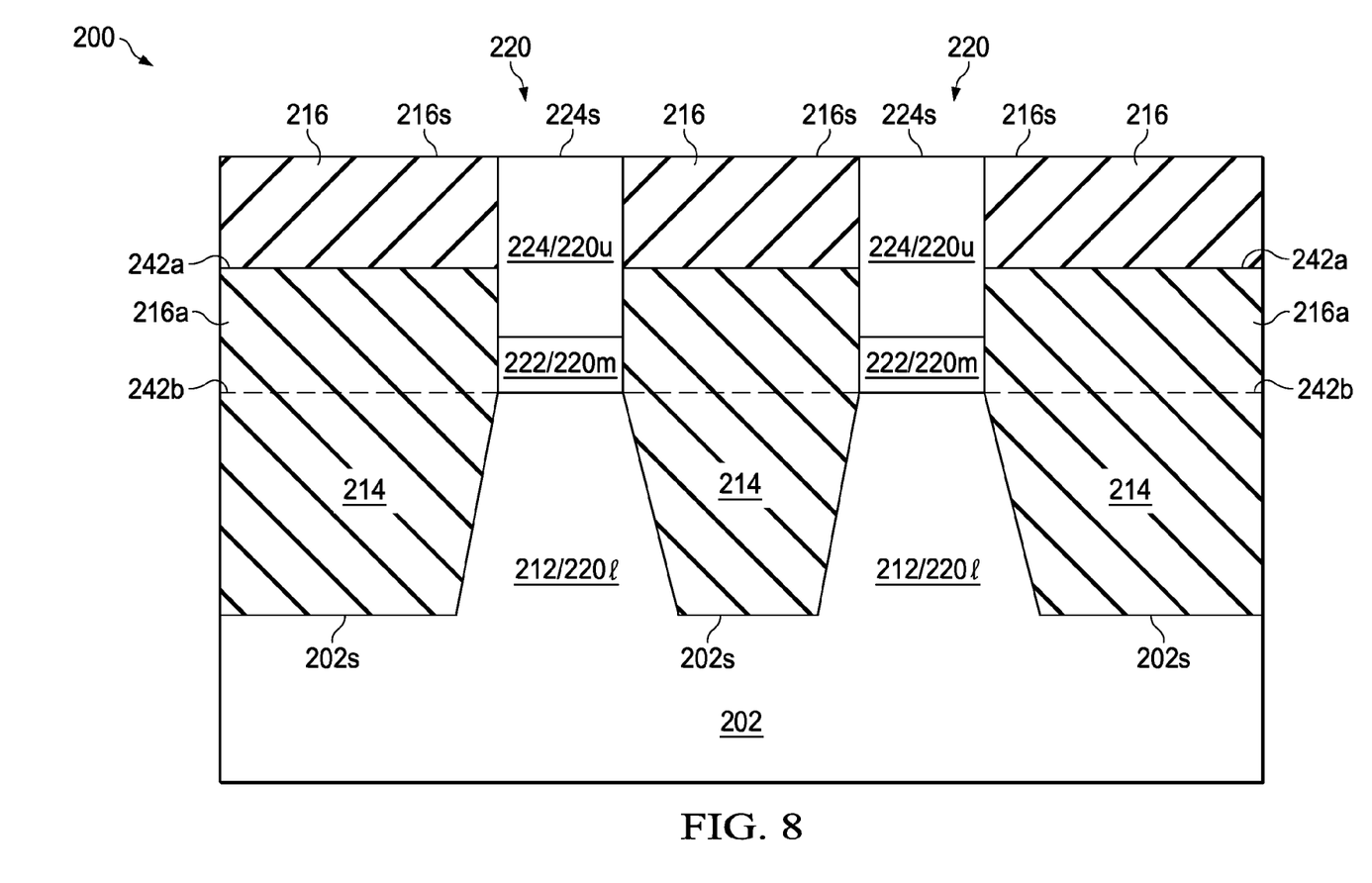

As representatively depicted in FIGS. 7 and 8, upper portions of semiconductor fins 212 may be replaced by other semiconductor material to enhance device performance. Using STI regions 216 as a hard mask, an anisotropic plasma etching process may be performed to recess semiconductor fins 212 that are unprotected or exposed to form fin recesses 212a between neighboring STI regions 216 (shown in FIG. 7 and step 106 of FIG. 1). Remaining portions of semiconductor fins 212 between neighboring STI regions 216 are hereinafter referred to as lower portion 220l of fin structure 220, protruding from the major surface 202s of substrate 202. In some embodiments, lower portion 220l may include a first semiconductor material 202 having the first lattice constant. In some embodiments, first semiconductor material 202 comprises Si or III-V semiconductor material. In some embodiments, the etching process may be performed using a chemical selected from $Cl_2$, HBr, $NF_3$, $CF_4$, and/or $SF_6$ as an etching gas.

Next, the structure of FIG. 8 may be produced by selectively growing a second semiconductor material 222 partially filling fin recess 212a, wherein second semiconductor material 222 has a second lattice constant different from the first lattice constant (step 108 in FIG. 1). In some embodiments, second semiconductor material 222 comprises Ge or SiGe. Further, second semiconductor material 222 may hereinafter be referred to as a middle portion 220m of fin structure 220.

In some embodiments, second semiconductor material 222 comprises Ge. In the representatively illustrated embodiment, second semiconductor material 222 (e.g., Ge) may be selectively grown by an LPCVD process to partially fill fin recess 212a. In one embodiment, an LPCVD process is performed at a temperature of about 350° C. to 450° C. and under a pressure of about 10 mTorr to about 100 mTorr, using $GeH_4$, $GeH_3CH_3$, and/or $(GeH_3)_2CH_2$ as epitaxial gases. Optionally, an anneal process may thereafter be performed at a temperature of about 550° C. to about 750° C. to confine dislocation defects on an interface of the Si and Ge epitaxial layer.

In some embodiments, second semiconductor material 222 comprises SiGe. In the representatively illustrated embodiment, second semiconductor material 222 (e.g., SiGe) may be selectively grown by an LPCVD process to partially fill fin recess 212a. In one embodiment, a LPCVD process is performed at a temperature of about 400° C. to about 800° C. and under a pressure of about 1 Torr to about 200 Torr, using $SiH_2Cl_2$, $SiH_4$, $GeH_4$, HCl, $B_2H_6$, and $H_2$ as reaction gases.

With continued reference to FIG. 8, subsequent to formation of second semiconductor material 222, the structure of FIG. 8 may be produced by selectively growing a third semiconductor material 224 filling fin recess 212a (step 110 of FIG. 1), wherein the third semiconductor material 224 may be substantially the same material as the first semiconductor material 202 having the first lattice constant.

In some embodiments, third semiconductor material 224 comprises Si. In the representatively illustrated embodiment, third semiconductor material 224 (e.g., Si) may be selectively grown by an LPCVD process to fill fin recess 212a. In the representatively illustrated embodiment, the LPCVD process may be performed at a temperature of about 400° C. to about 800° C. and under a pressure of about 1 Torr to about 100 Torr, using $SiH_4$, and $H_2$ as reaction gases.

After selective growth, a planarization or CMP process may be performed, so that a top surface 224s of third semiconductor material 224 may be substantially level with a top surface 216s of STI regions 216. In some embodiments, third semiconductor material 224 forms upper portions 220u of fin structure 220. As such, fin structure 220 comprises lower portion 220l, upper portion 220u, and middle portion 220m between lower portion 220l and upper portion 220u.

Figure 9:
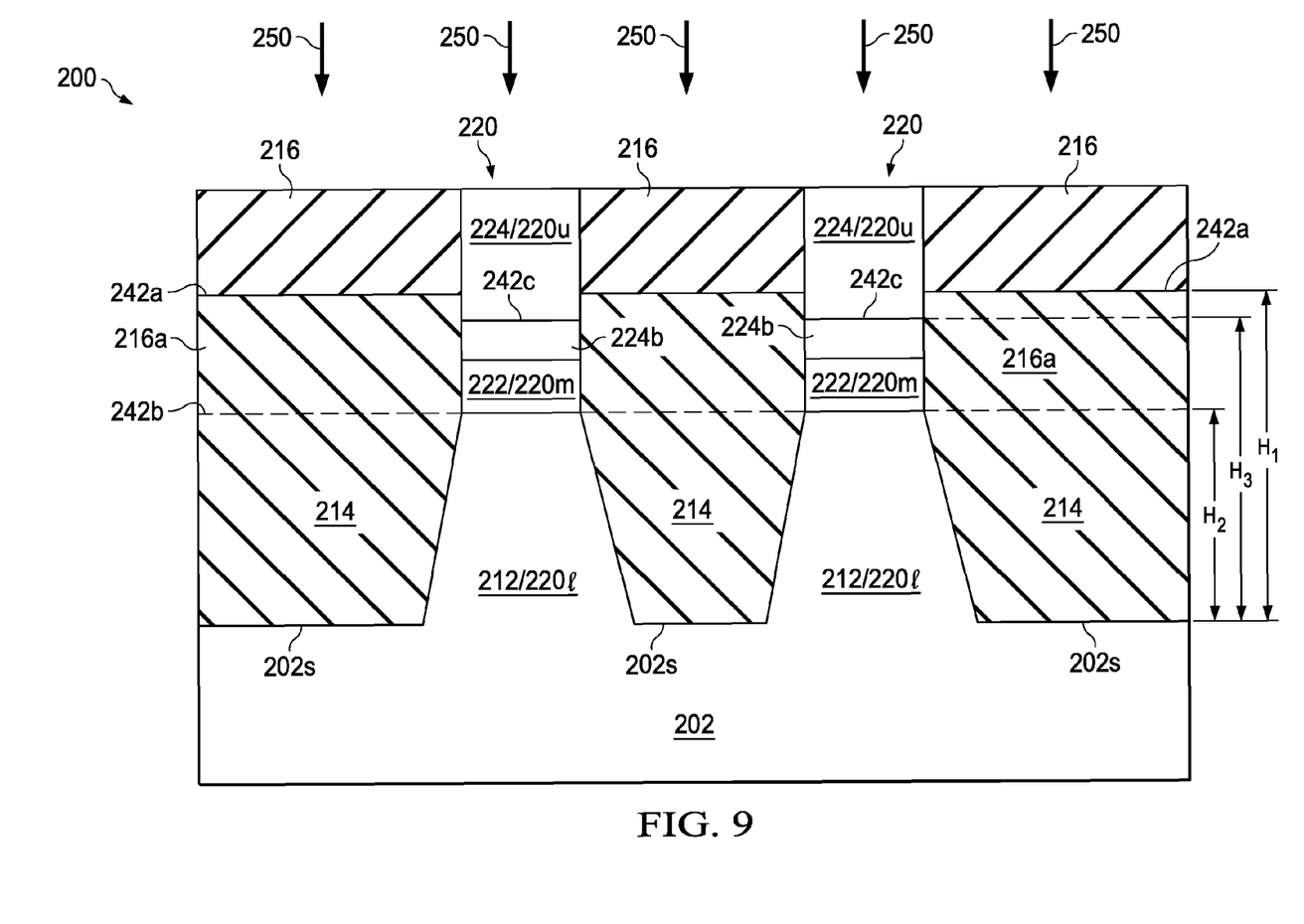

As representatively illustrated in FIG. 9 and step 112 of FIG. 1, after forming fin structure 220, the structure of FIG. 9 may be produced by performing a second implantation process 250 to third semiconductor material 224, wherein a bottom portion of third semiconductor material 224 comprises dopant 242 with a third peak concentration 242c equal to or less than peak concentration 242a or 242b. In some embodiments, a ratio of peak concentration 242a or 242b (e.g., with greater implantation time) to third peak concentration 242c (e.g., with less implantation time) is from about 2 to about 4. In the representatively illustrated embodiment, third peak concentration 242c of dopant 242 may act as APT dopants in semiconductor fins 212, whereby each fin of semiconductor fins 212 may be isolated from neighboring fins.

In some embodiments, a step of performing a second implantation process 250 to the third semiconductor material 224 may be performed at an energy between about 50 KeV to about 100 KeV and at a dose between about 1E13 atoms/cm$^2$ to about 1E14 atoms/cm$^2$. As a result of the second implantation process 250, third peak concentration 242c of dopant 242 may be produced in a bottom portion 224b of third semiconductor material 224 adjacent to doped portion 216a of STI region 216, while a fourth peak concentration (not shown) of dopant 242 may be produced in doped portion 216a of STI region 216 adjacent to bottom portion 224b of third semiconductor material 224.

In a representative lower-energy embodiment, a first height $H_1$ (between a point of first peak concentration 242a and major surface 202s) may be equal to or greater than a third height $H_3$ (between a point of third peak concentration 242c and major surface 202s). In some embodiments, a ratio of first height $H_1$ to third height $H_3$ is from about 1 to about 1.5.

In a representative higher-energy embodiment, a second height $H_2$ (between a point of second peak concentration 242b and major surface 202s) may be less than a third height $H_3$ (between a point of third peak concentration 242c and major surface 202s). In some embodiments, a ratio of second height $H_2$ to third height $H_3$ is from about 0.5 to about 0.9.

Figure 10:
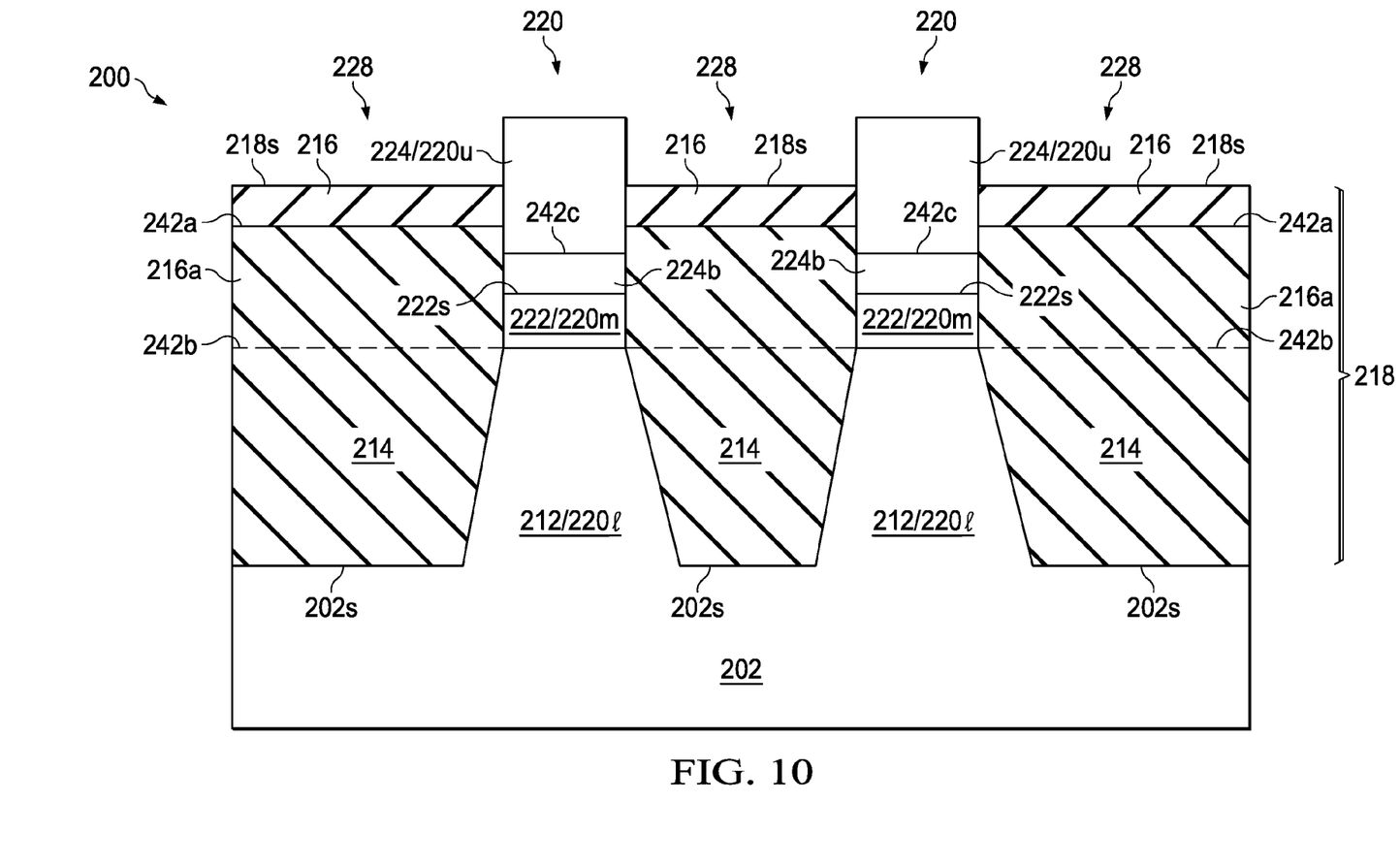

Thereafter, STI regions 216 may be recessed with etching to expose a portion of upper portion 220u, resulting in recesses 228 and a remaining oxide 214 (shown in FIG. 10). Remaining oxide 214 surrounding fin structure 220 may hereinafter be referred to as an isolation structure 218, wherein a top surface 218s of isolation structure 218 is higher than a top surface 222s of second semiconductor material 222. In some embodiments, etching may be performed using a wet etching process, for example, by dipping the substrate 202 in hydrofluoric acid (HF). In some embodiments, etching may be performed using a dry etching process, for example, using $CHF_3$ or $BF_3$ as etching gases. In the representatively illustrated embodiment, the exposed portion (e.g., of upper portion 220u) comprises source/drain (S/D) portions and a channel portion between the S/D portions. In some embodiments, a gate structure 230 comprising a gate dielectric 232 and a gate electrode 234 traverses over channel portion of fin structure 220 (shown in FIG. 11).

As such, FinFET 200 comprises substrate 202 having major surface 202s; fin structure 220 protruding from major surface 202s comprises lower portion 220l comprising first semiconductor material 202 having a first lattice constant; upper portion 220u comprising first semiconductor material 202, wherein bottom portion 224b of upper portion 220u comprises dopant 242 with third peak concentration 242c; middle portion 220m between lower portion 220l and upper portion 220u, wherein middle portion 220m comprises second semiconductor material 222 having a second lattice constant different from the first lattice constant; and an isolation structure 218 surrounding fin structure 220, wherein a doped portion 216a of isolation structure 218 adjacent to bottom portion 224b of upper portion 220u comprises dopant 242 with first or second peak concentration 242a or 242c equal to or greater than third peak concentration 242c. Thus, using isolation structure 218 with dopant 242 to substantially impede or otherwise reduce ATP dopant out-diffusion from fin structure 220, representative embodiments provide methods that may suitably achieve desired device performance characteristics, such as at least reducing APT effects and leakage.

FIGS. 12 and 13 are cross-sectional views of a FinFET 300 at various stages of fabrication according to various representative embodiments of the present disclosure. FIG. 12 shows FinFET 300 (of FIG. 10) after forming a pair of notches in fin structure 220. The structure of FIG. 12 may be produced by performing an oxidation process 260 to substrate 202 to form a pair of notches 236 extending into opposite sides of middle portion 220m.

As a result of oxidation, rather than oxidizing outer surfaces of upper portion 220u (e.g., with low strain or no strain), a pair of notches 236 are generated adjacent to second semiconductor material 222 (e.g., with high strain). In some embodiments, the pair of notches 236 extend into opposite sides of second semiconductor material 222 (e.g., in an inward direction) and further extends into an upper edge portion of first semiconductor material 202 and a lower edge portion of third semiconductor material 224. In some embodiments, the pair of notches 236 comprises $GeO_x$ or $SiGeO_x$. In some embodiments, a gate structure 230 comprising a gate dielectric 232 and a gate electrode 234 traverses over a channel portion of fin structure 220 (shown in FIG. 13).

In the representatively illustrated embodiment, the pair of notches 236 and remaining second semiconductor material 222a may be combined and also hereinafter referred to as a middle portion 320m of a fin structure 320. In some embodiments, upper portion 220u, middle portion 320m, and lower portion 220l may be combined and also hereinafter referred to as fin structure 320.

As such, FinFET 300 comprises substrate 202 having major surface 202s; fin structure 320 protruding from the major surface 202s comprises lower portion 220l comprising first semiconductor material 202 having a first lattice constant; upper portion 220u comprising first semiconductor material 202, wherein bottom portion 224b of upper portion 220u comprises dopant 242 with third peak concentration 242c; middle portion 320m between lower portion 220l and upper portion 220u, wherein middle portion 320m comprises second semiconductor material 222a having a second lattice constant different from the first lattice constant; a pair of notches 236 extending into opposite sides of middle portion 320m; and an isolation structure 218 surrounding fin structure 320, wherein doped portion 216a of isolation structure 218 adjacent to bottom portion 224b of upper portion 220u comprises dopant 242 with a first or second peak concentration 242a or 242b equal to or greater than third peak concentration 242c.

Thus, using isolation structure 218 with dopant 242 to substantially impede or otherwise reduce ATP dopant out-diffusion from fin structure 320, and further using fin structure 320 with a pair of notches 236 to narrow a carrier transportation path between adjacent fins, representative embodiments provide methods that may achieve desired device performance characteristics, such as at least reducing APT effects and leakage.

It will be understood that FinFET 200 or FinFET 300 may undergo further CMOS processing to form various features such as, e.g., contacts/vias, interconnect metal layers, dielectric layers, passivation layers, etc.

In accordance with representative embodiments, a fin field effect transistor (FinFET) comprises a substrate having a major surface; a fin structure protruding from the major surface comprising a lower portion comprising a first semiconductor material having a first lattice constant; an upper portion comprising the first semiconductor material, wherein a bottom portion of the upper portion comprises a dopant with a first peak concentration; a middle portion between the lower portion and upper portion, wherein the middle portion comprises a second semiconductor material having a second lattice constant different from the first lattice constant; and an isolation structure surrounding the fin structure, wherein a portion of the isolation structure adjacent to the bottom portion of the upper portion comprises the dopant with a second peak concentration equal to or greater than the first peak concentration.

In accordance with another representative embodiment, a fin field effect transistor (FinFET) comprises a substrate having a major surface; a fin structure protruding from the major surface comprising a lower portion comprising a first semiconductor material having a first lattice constant; an upper portion comprising the first semiconductor material, wherein a bottom portion of the upper portion comprises a dopant with a first peak concentration; a middle portion between the lower portion and upper portion, wherein the middle portion comprises a second semiconductor material having a second lattice constant different from the first lattice constant; a pair of notches extending into opposite sides of the middle portion; and an isolation structure surrounding the fin structure, wherein a portion of the isolation structure adjacent to the bottom portion of the upper portion comprises the dopant with a second peak concentration equal to or greater than the first peak concentration.

In accordance with another representative embodiment, a method of fabricating a fin field effect transistor comprises providing a substrate having a shallow trench isolation (STI) region surrounding a semiconductor fin, wherein the substrate comprises a first semiconductor material having a first lattice constant; performing a first implantation process to the STI region, whereby a portion of the STI region comprises a dopant with a first peak concentration; recessing the semiconductor fin to form a fin recess; selectively growing a second semiconductor material partially filling the fin recess, wherein the second semiconductor material has a second lattice constant different from the first lattice constant; selectively growing a third semiconductor material filling the fin recess; and performing a second implantation process to the third semiconductor material, wherein a bottom portion of the third semiconductor material comprises the dopant with a second peak concentration equal to or less than the first peak concentration.

While the disclosure has been described by way of examples and in terms of representative embodiments, it will be understood that the invention is not limited to the disclosed embodiments. To the contrary, the disclosure is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a fin field effect transistor (FinFET), the method comprising:
    providing a substrate having a shallow trench isolation (STI) region surrounding a semiconductor fin, wherein the substrate comprises a first semiconductor material having a first lattice constant;
    performing a first implantation process to the STI region, whereby a portion of the STI region comprises a dopant with a first peak concentration;
    recessing the semiconductor fin to form a fin recess;
    selectively growing a second semiconductor material partially filling the fin recess, wherein the second semiconductor material has a second lattice constant different from the first lattice constant;
    selectively growing a third semiconductor material filling the fin recess; and
    performing a second implantation process to the third semiconductor material, wherein a bottom portion of the third semiconductor material comprises the dopant with a second peak concentration equal to or less than the first peak concentration.

2. The method of claim 1, further comprising performing a third implantation process to the STI region, whereby a portion of the STI region comprises a dopant with a third peak concentration, the third implantation process being performed after the first implantation process and before the second implantation process.

3. The method of claim 2, wherein performing the third implantation process to the STI region is performed at an energy of about 120 KeV and at a dose between about 1E13 atoms/cm$^2$ to 1E14 atoms/cm$^2$.

4. The method of claim 1, further comprising performing a fourth implantation process to the STI region, whereby a portion of the STI region comprises a dopant with a fourth peak concentration, the fourth implantation process being performed concurrent with the second implantation process.

5. The method of claim 4, wherein performing the second implantation process to the third semiconductor material and the fourth implantation process to the STI region is performed at an energy between about 50 KeV to about 100 KeV and at a dose between about 1E13 atoms/cm$^2$ to 1E14 atoms/cm$^2$.

6. The method of claim 1, wherein performing the second implantation process to the third semiconductor material is performed at an energy between about 50 KeV to about 100 KeV and at a dose between about 1E13 atoms/cm$^2$ to 1E14 atoms/cm$^2$.

7. The method of claim 1, wherein selectively growing a second semiconductor material partially filling the fin recess is performed using a LPCVD process.

8. The method of claim 1, wherein selectively growing a third semiconductor material filling the fin recess is performed using a LPCVD process.

9. The method of claim 1, further comprising performing an oxidation process to form a pair of notches extending into opposite sides of the second semiconductor material.

10. A method of fabricating a fin field effect transistor (FinFET), the method comprising:
    providing a substrate having a shallow trench isolation (STI) region surrounding a semiconductor fin, wherein the substrate comprises a first semiconductor material having a first lattice constant;
    performing a first implantation process to the STI region, whereby a portion of the STI region comprises a dopant with a first peak concentration at a first height above the substrate;
    recessing the semiconductor fin to form a fin recess;
    selectively growing a second semiconductor material partially filling the fin recess, wherein the second semiconductor material has a second lattice constant different from the first lattice constant;
    selectively growing a third semiconductor material filling the fin recess; and
    performing a second implantation process to the third semiconductor material, wherein a bottom portion of the third semiconductor material comprises the dopant with a second peak concentration at a second height above the substrate, the second peak concentration equal to or less than the first peak concentration, the first height greater than the second height.

11. The method of claim 10, further comprising performing a third implantation process to the STI region, whereby a portion of the STI region comprises a dopant with a third peak concentration at a third height above the substrate, the third implantation process being performed after the first implantation process and before the second implantation process, the third height less than the first height, the third height less than the second height.

12. The method of claim 11, further comprising performing a fourth implantation process to the STI region, whereby a portion of the STI region comprises a dopant with a fourth peak concentration at a fourth height above the substrate, the fourth implantation process being performed concurrent with the second implantation process, the fourth height less than the first height, the fourth height greater than the third height.

13. The method of claim 12, wherein at least one of:
a first ratio of the third peak concentration to the second peak concentration is from about 2 to about 4; and
a second ratio of the first peak concentration to the second peak concentration is from about 2 to about 4.

14. The method of claim 12, wherein a ratio of the second height to the fourth height is from about 0.5 to about 0.9.

15. The method of claim 10, wherein a ratio of the first height to the second height is from about 1 to about 1.5.

16. A method of fabricating a fin field effect transistor (FinFET), the method comprising:
providing a substrate having a shallow trench isolation (STI) region surrounding a semiconductor fin, wherein the substrate comprises a first semiconductor material having a first lattice constant, the semiconductor fin extending away from a major surface of the substrate;
performing a first implantation process to the STI region, whereby a portion of the STI region comprises a dopant with a first peak concentration at a first height above the major surface of the substrate;
recessing the semiconductor fin to form a fin recess;
selectively growing a second semiconductor material partially filling the fin recess, wherein the second semiconductor material has a second lattice constant different from the first lattice constant;
selectively growing a third semiconductor material filling the fin recess;
forming a pair of notches extending into opposite sides of the second semiconductor material; and
performing a second implantation process to the third semiconductor material, wherein a bottom portion of the third semiconductor material comprises the dopant with a second peak concentration at a second height above the major surface of the substrate, the second peak concentration equal to or less than the first peak concentration, the first height greater than the second height.

17. The method of claim 16, wherein the pair of notches further extends into an upper edge portion of the first semiconductor material and a lower edge portion of the third semiconductor material.

18. The method of claim 16, wherein forming the pair of notches comprises an oxidation process.

19. The method of claim 16, wherein selectively growing a second semiconductor material partially filling the fin recess is performed using a LPCVD process.

20. The method of claim 16, wherein selectively growing a third semiconductor material filling the fin recess is performed using a LPCVD process.

* * * * *